US008854851B2

(12) United States Patent
Rodriguez

(10) Patent No.: US 8,854,851 B2
(45) Date of Patent: Oct. 7, 2014

(54) TECHNIQUES FOR SUPPRESSING MATCH INDICATIONS AT A CONTENT ADDRESSABLE MEMORY

(75) Inventor: Samuel Rodriguez, Northborough, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 13/602,633

(22) Filed: Sep. 4, 2012

(65) Prior Publication Data
US 2014/0063886 A1 Mar. 6, 2014

(51) Int. Cl.
*G11C 15/04* (2006.01)
(52) U.S. Cl.
USPC .................. 365/49.17; 365/189.05; 365/49.1
(58) Field of Classification Search
USPC .................................. 365/49.17, 189.05, 49.1
See application file for complete search history.

(56) References Cited

U.S. PATENT DOCUMENTS 6,505,260 B2 * 1/2003 Chin et al. ...................... 710/41
7,814,243 B2 * 10/2010 Hamilton ....................... 710/52

* cited by examiner

*Primary Examiner* — Richard Elms
*Assistant Examiner* — Mohammed A Bashar

(57) ABSTRACT

A content addressable memory (CAM) suppresses an indication of a match in response to determining that the entry that stores data matching received compare data is the subject of a write operation. To suppress the indication, an address decoder decodes a write address associated with the write operation to determine the entry of the CAM that is the subject of the write operation, and provides control signaling indicative of the determined entry. The CAM uses the control signaling to suppress any match indications for the entry being written, thereby preventing erroneous match indications.

20 Claims, 5 Drawing Sheets

TECHNIQUES FOR SUPPRESSING MATCH INDICATIONS AT A CONTENT ADDRESSABLE MEMORY

FIELD OF THE DISCLOSURE

The present disclosure relates to content addressable memories.

BACKGROUND

Processors often employ content addressable memories (CAMs) to store data structures that are frequently searched. Typically, compare data (e.g. a memory address or cache tag) is supplied to a CAM, which then searches its entries in parallel for data matching the compare data. If an entry stores data matching the compare data, the CAM provides an indicator identifying the entry. The parallel search capability of the CAM renders it well-suited for high-speed searching applications, such as in cache tag arrays used to determine if a cache stores data associated with an identified memory address. In order to enhance access speed, the CAM may be configured so that data may be written to the CAM concurrently with a search of the CAM for compare data. The concurrent write and compare operations can result in an erroneous indication that the CAM stores the compare data when the CAM entry that matches the compare data is the target of the write operation. Conventional CAM implementations avoid this issue by employing circuitry that forces the concurrent compare operation to take place after the write data is written to the corresponding CAM entry. However, such circuitry increases the circuit area and power consumed by the processor.

BRIEF DESCRIPTION OF THE DRAWINGS

The embodiments may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-5 illustrate techniques for suppressing an indication of a match at a CAM in response to a compare operation when the CAM entry that stores data matching received compare data is the subject of a write operation concurrent with the compare operation. To suppress the indication, an address decoder decodes a write address associated with the write operation to determine the entry of the CAM that is the subject of the write operation and provides control signaling indicative of the determined entry. The CAM uses the control signaling to suppress any match indications for the entry being written, thereby preventing erroneous match indications. The CAM thereby allows for concurrent write and compare operations without requiring complex circuitry to ensure that the compare operation takes place after the write operation.

Figure 1:
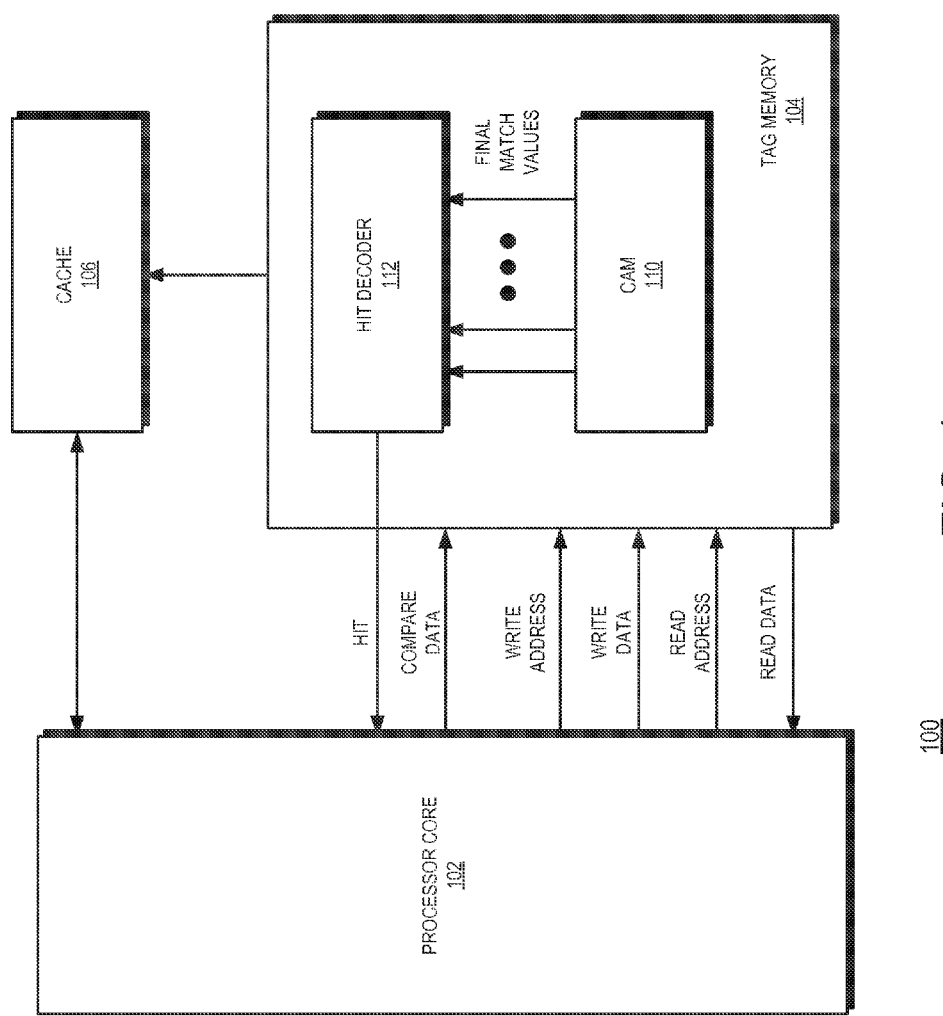
FIG. 1 is a block diagram of a processor employing a content addressable memory (CAM) in accordance with some embodiments.

FIG. 1 illustrates a block diagram of a processor 100 in accordance with some embodiments. The processor 100 executes the instructions of computer programs order to carry out tasks for an electronic device, such as a personal computer, server, cell phone or other telephone device, game console, and the like. In the illustrated example, the processor 100 includes a processor core 102, a tag memory 104, and a cache 106. The processor 100 can also include additional components to facilitate the execution of instructions, including additional processor cores, caches, and tag memories, as well as one or more graphics processing units (GPUs) and input/output interfaces such as such as universal serial bus (USB) interfaces, Peripheral Component Interconnect-express (PCI-E) interfaces, and the like. The processor 100 can further include components to facilitate communication between the one or more processor cores, the memory, the GPUs, and the input/output interfaces, such as a southbridge and a northbridge. In some embodiments, the processor 100 is incorporated in a processing system that includes memory devices such as random access memory (RAM), disc or optical drives, flash memory, and the like, input/output devices, network interfaces, and the like. In some embodiments, the processor core 102, tag memory 104, and cache 106 are incorporated in a common semiconductor die and the memory is incorporated in a separate semiconductor die.

In the course of executing instructions, the processor core 102 generates read and write operations (collectively, "memory access operations") to request data be loaded or stored at a corresponding memory address. The processor 100 employs a caching structure whereby the processor core 102 first attempts to satisfy memory access operations at the cache 106. If data associated with the memory address of a memory access operation is not located at the cache 106, the processor core 102 retrieves the data from memory and transfers it to the cache 106 and then satisfies the memory access operation at the cache 106.

To allow the processor core 102 to quickly determine whether data associated with a memory address is stored at the cache 106, the processor 100 employs the tag memory 104 to store tag information for the data stored at the cache 106. To illustrate, the tag memory 104 includes a CAM 110 and a hit decoder 112. The CAM 110 is a memory including a set of entries, whereby each entry stores a tag indicating the memory address of data stored at a corresponding line of the cache 106. The CAM 110 is configured to carry out write operations, read operations, and compare operations in response to corresponding requests from the processor core 102. To illustrate, in response to storing data at the cache 106, the processor core 102 determines a tag for the data based on the memory address associated with the cache 106. For example, in some embodiments the processor core 102 determines the tag by selecting a portion of the memory address associated with the data. The processor core 102 writes the tag to the CAM 110 using a write operation. In particular, the processor core 102 initiates the write operation by providing to the CAM 110 a write address indicating the entry of the CAM 110 to be written and write data indicating the tag. In response to receiving the write address and write data the CAM 110 completes the write operation by storing the write data at the entry of the CAM 110 corresponding to the write address.

In the course of executing some instructions, the processor core 102 generates read operations to read tag information at the CAM 110. To initiate a read operation, the processor core 102 provides to the CAM 110 a read address indicating the location of the CAM 110 to be read. In response, the CAM 110 provides the read data stored at the entry of the CAM 110 corresponding to the read address.

To determine if data corresponding to a memory address is stored at the cache 106, the processor core 102 initiates a compare operation by providing the tag associated with the memory address to the CAM 110 as compare data. In response, the CAM 110 performs a parallel search of its entries to determine if any of its entries stores the compare data. In particular, the CAM 110 generates a set of values, designated "final match values", whereby each final match value corresponds to a different entry of the CAM 110. The CAM 110 asserts a given final match value based on whether the corresponding entry of the CAM 110 stores the compare data. The hit decoder 112 decodes the final match values to generate a signal labeled "HIT", such that the HIT signal is asserted in response to the final match values indicating one of the entries at the CAM 110 stores the compare data. Accordingly, in response to assertion of the HIT signal, the processor core 102 determines that the cache 106 stores data associated with the memory address corresponding to the compare data (the tag). In response to the HIT signal being maintained in a negated state, the processor core 102 determines that the cache 106 does not store the data associated with the memory address, and therefore retrieves the data from memory. In some embodiments, the HIT signal can be implemented as a collection of signals that provides an index to the entry of the CAM 110 that stores the compare data.

As described further herein, the CAM 110 asserts a given final match value in response to determining both of the following conditions are satisfied: 1) the entry of the CAM 110 stores the compare data; and 2) the entry of the CAM 110 that stores the compare data is not the subject of a concurrent write operation. If the CAM 110 determines that either of these conditions is not satisfied, the CAM 110 indicates, via the final miss values, that the compare data is not stored at the entries of the CAM 110. By asserting a final match value only when both of the above conditions are satisfied, the CAM 110 reduces erroneous match indications, thereby reducing errors at the processing system. To illustrate, when new data corresponding to a new memory address is written to a cache line of the cache 106, the tag corresponding to the memory address (referred to as the "new tag") is provided to the CAM 110 as the write data for a write operation. The tag thereby replaces the tag previously stored (referred to as the "previous tag") at the entry of the CAM 110 corresponding to the cache line. However, if the processor core 102 initiates a compare operation with the previous tag while the new tag is being written, it is possible that the compare operation could take place before the new tag has replaced the previous tag, resulting in an erroneous indication of a hit. This erroneous indication would result in the processor core 102 retrieving the incorrect data at the cache 106, resulting in program execution errors. By preventing a match indication for entries being written, the CAM 110 prevents the erroneous indication of the match, thereby preventing the program execution errors.

Figure 2:
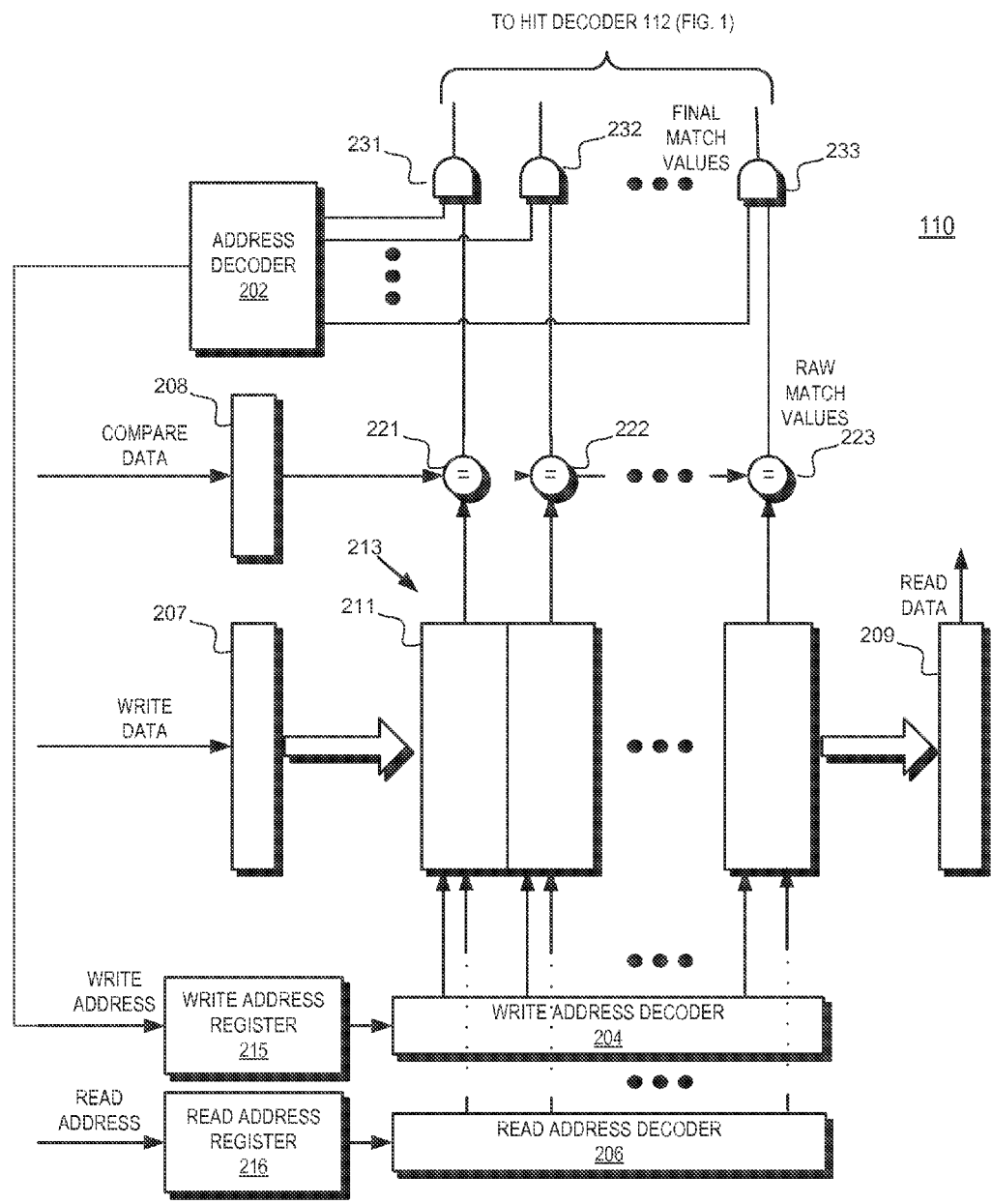
FIG. 2 is a block diagram of the CAM of the processor of FIG. 1 in accordance with some embodiments.

FIG. 2 illustrates a block diagram of the CAM 110 in accordance with some embodiments. The CAM 110 includes a storage array 213 including N entries (e.g., entry 211), whereby each entry is configured to store data associated with a different memory address. To facilitate the write, read, and compare operations, the CAM 110 includes an address decoder 202, a write address decoder 204, a read address decoder 206, a write data register 207, a compare data register 208, a read data register 209, a write address register 215, and a read address register 216. The CAM 110 further includes N compare modules (e.g. compare modules 221, 222, and Nth compare module 223) and N AND gates (e.g. AND gate 231, AND gate 232, and Nth AND gate 233). The write data register 207, write address register 215, and write address decoder 204 are used to effectuate write operations. To illustrate, a write operation is initiated by storing the write address at the write address register 215 and the write data at the write data register 207. In response the write address decoder 204 decodes the write address to select the entry of the storage array 213 corresponding to the write address. The write address decoder 204 provides control signaling to the selected entry, which in response stores the write data from the write data register 207.

Read operations are facilitated by the read address register 216, the read address decoder 206, and the read data register 209. A read operation is initiated by storing a read address to the read address register 216. In response, the read address decoder 206 decodes the read address to select the entry of the storage array 213 corresponding to the read address. The read address decoder 206 provides control signaling to the selected entry, which in response provides the data stored at the entry to the read data register 209. The read data register 209 stores the read data for subsequent access by, for example, the processor core 102.

Compare operations are facilitated by the address decoder 202, the compare data register 208, the compare modules 221-223, and the AND gates 231-233. To illustrate, each of the compare modules 221-223 is connected to a corresponding entry of the storage array 213, and each of the AND gates 231-233 includes an input connected to a corresponding output of the compare modules 221-223. The address decoder 202 also includes a set of outputs connected to corresponding inputs of the AND gates 231-233. A compare operation is initiated by storing compare data to the compare data register 208. In response, each of the compare modules compares the compare data to the data stored at the corresponding entry of the storage array 213. In response to determining that data stored at an entry of the storage array 213 matches the compare data, the corresponding compare module asserts a signal at its output. The compare modules 221-223 thus provide a set of "raw match values" indicating which entry, if any, of the storage array 213 stores data that matches the compare data.

The address decoder 202 and the AND gates 231-233 together suppress any match indications in the raw match values for entries of the storage array 213 that are the subject of a write operation concurrent with the compare operation. As used herein, a write operation and a compare operation are concurrent if both operations take place in the same cycle of a clock signal used to synchronize operations of the CAM 110. As used herein, an entry of a storage array is the subject of a write operation if the write operation results in data being written to the entry.

The outputs of the AND gates 231-233 provide a set of final match values based on the raw match values provided by the compare modules 221-223 and the signals provided by the address decoder 202. When no address is stored at the write address register 215, indicating that no write operation is taking place, the address decoder 202 maintains signals at each of its outputs in asserted states. Accordingly, when no write operation is taking place, the final match values generated by the AND gates 231-233 are the raw match values generated by the compare modules 221-223. In response to a write address being stored at the write address register 215, thus indicating a write operation, the address decoder 202 decodes the write address to select the one of its outputs connected the AND gate corresponding to the entry of the storage array 213 indicated by the write address and negates a signal at the selected output. For example, in response to decoding the write address corresponding to entry 211 of the storage array 213, the address decoder 202 negates the signal provided to the AND gate 231. By negating the output signal, the address decoder 202 thereby suppresses any potential match indication in the raw match value for an entry that is being written. Thus, the final match values generated by the AND gates 231-233 will not indicate a match for an entry of the storage array that is the subject of a write operation, even if that entry indicates a match in the raw match values.

Figure 3:
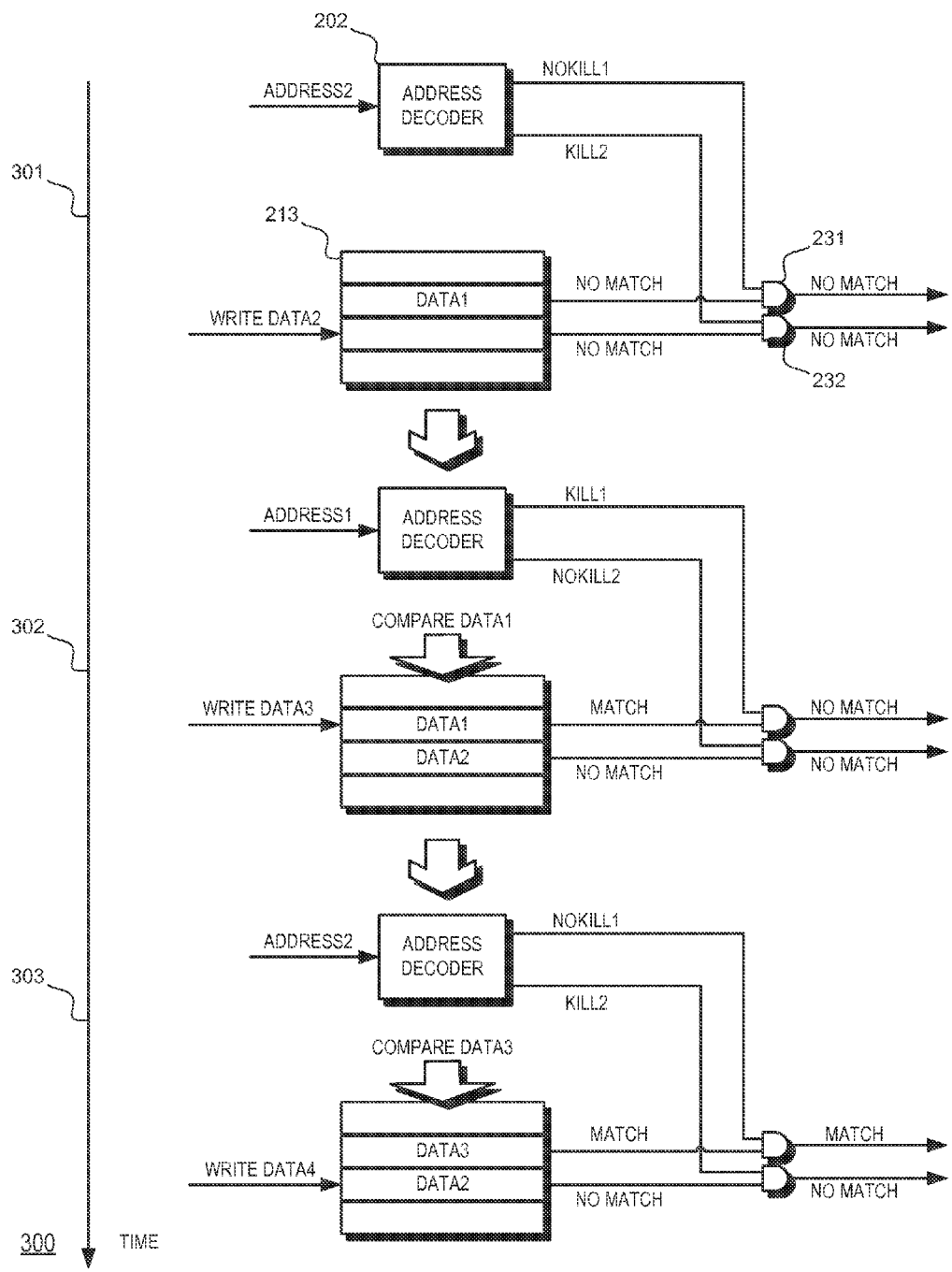
FIG. 3 is a diagram illustrating a timeline showing example operations of the CAM of FIG. 2 in accordance with some embodiments.

FIG. 3 illustrates a timeline 300 showing example operations at the CAM 110 of FIGS. 1 and 2 in accordance with some embodiments. At time 301, data designated "DATA1" is stored at an entry of the storage array 213, where the entry is associated with an address designated "ADDRESS1". The CAM 110 undergoes a write operation to write data (designated "DATA2") to another entry associated with "ADDRESS2." There is no concurrent compare operation at time 301. Accordingly, the address decoder 202 maintains the output signal for the ADDRESS1 entry in an asserted state (designated "NOKILL1") and places the output signal for the ADDRESS2 entry in a negated stated (designated "KILL2"). In addition, because there is no compare operation taking place, the raw match values for the ADDRESS1 and ADDRESS2 entries both indicate no match. Thus, the final match values for the ADDRESS1 and ADDRESS2 entries correctly indicate no match at the CAM 110.

At time 302, the CAM 110 undergoes a compare operation for the compare data "DATA1" stored at the ADDRESS1 entry. Concurrently, the ADDRESS1 entry is the subject of a write operation to write data designated DATA3. The compare operation causes the compare module for the ADDRESS1 entry to generate a signal indicating a match. However, the compare operation also causes the address decoder 202 to place the output signal associated with the ADDRESS1 entry in a negated state, designated "KILL1." The AND gate 231 combines the signal indicating the match with the output signal in the KILL1 state so that the final match values indicate no match for the ADDRESS1 entry. The AND gate 231 thus suppresses the match indication generated by the compare module for the ADDRESS1 entry, thereby preventing an erroneous match indication.

At time 303, the CAM 110 undergoes a compare operation for the compare data "DATA3" stored at the ADDRESS1 entry. Concurrently, the ADDRESS2 entry is the subject of a write operation to write data designated DATA3. The compare operation causes the compare module for the ADDRESS1 entry to generate a signal indicating a match. The compare operation also causes the address decoder 202 to place the output signal associated with the ADDRESS2 entry in a negated state, designated "KILL2." However, the address decoder 202 maintains the output signal associated with the ADDRESS1 entry in an asserted state. Accordingly, the output of the AND gate 231 generates an output signal indicating a match based on the signal indicating a match generated by the compare module for the ADDRESS1 entry. Thus, because the concurrent write operation is to a different entry than the entry that indicates a match, the indication of a match is not suppressed in the final match values.

Figure 4:
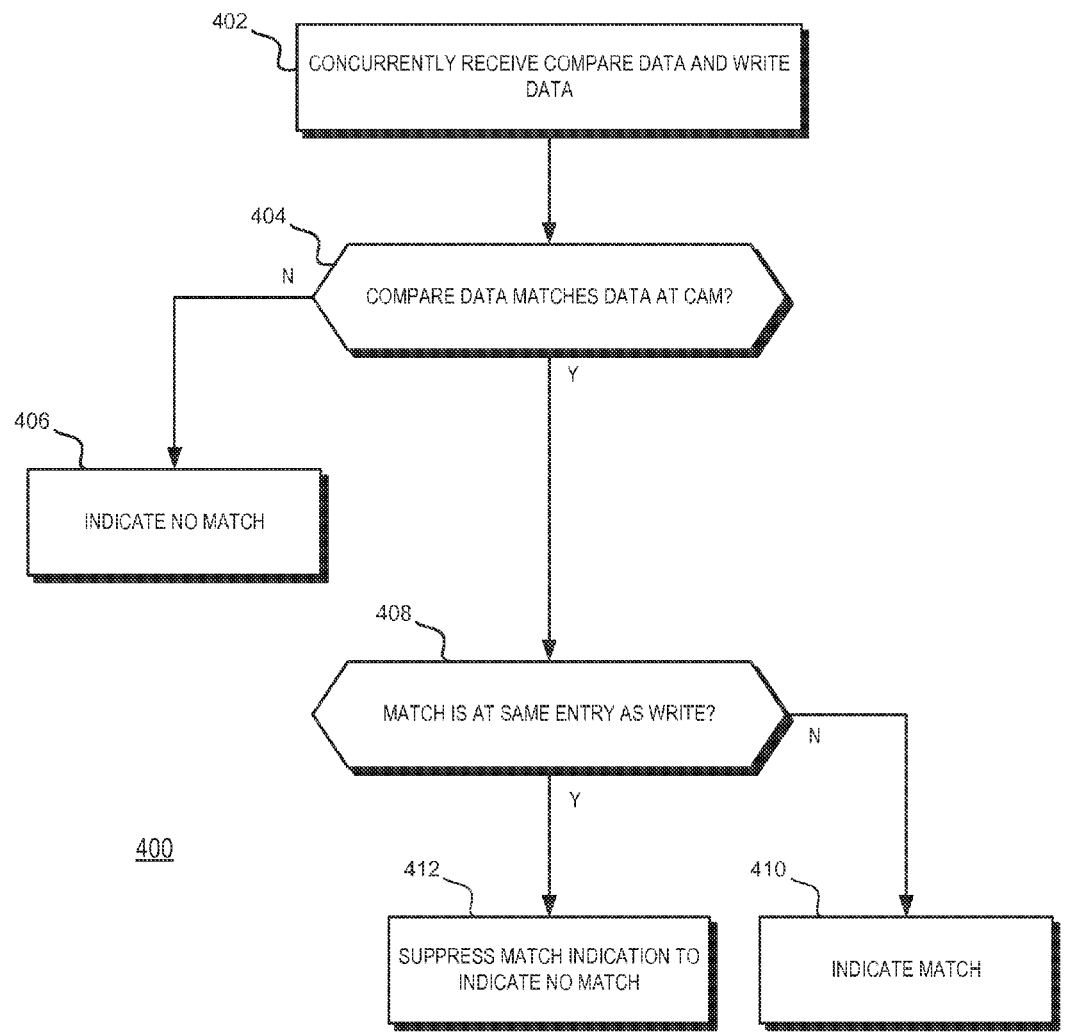
FIG. 4 is a flow diagram of a method of suppressing match indications at the CAM of FIG. 1 in accordance with some embodiments.

FIG. 4 is a flow diagram of a method 400 of suppressing match indications at a CAM in accordance with sonic embodiments. For ease of illustration, the method 400 is described with respect to an example operation at the CAM 110 of FIGS. 1 and 2. At block 402 the write data register 207 receives write data and the write address register 215 receives a write address, indicating the initiation of a write operation. Concurrently, the compare data register 208 receives compare data, indicating initiation of a compare operation. At block 404 the compare modules 221-223 determine if any of the entries of the storage array 213 store data that matches the compare data. If not, the method flow moves to block 406 and the AND gates 231-233 generate final match values indicating there is no match at the CAM 110.

Returning to block 404, if one of the compare modules 221-223 determines that an entry of the storage array 213 stores the compare data, the method flow proceeds to block 408 and the address decoder 202 and the AND gates 231-233 together determine if the entry that stores the compare data is also the subject of a write operation. If not, the method flow proceeds to block 410 and the final match values generated by the AND gates 231-233 indicate a match at the CAM 110. If, at block 408, the entry that stores the compare data is the subject of a write operation, the method flow proceeds to block 412 and the AND gates 231-233 suppress the match indication generated by the compare modules 221-223, and therefore indicate there is no match at the CAM 110.

In some embodiments, the apparatus and techniques described above are implemented in a system comprising one or more integrated circuit (IC) devices (also referred to as integrated circuit packages or microchips), such as an integrated circuit device implementing a CAM as described above with reference to FIGS. 1-4. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 5:
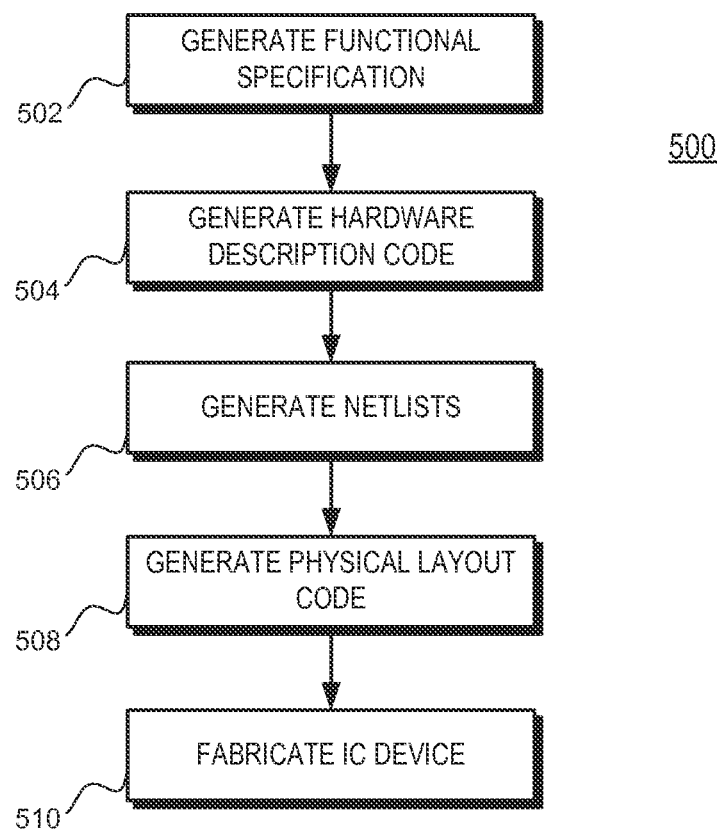
FIG. 5 is a flow diagram illustrating a method for designing and fabricating an integrated circuit device implementing at least a portion of a component of a processing system in accordance with some embodiments.

FIG. 5 is a flow diagram illustrating an example method 500 for the design and fabrication of an IC device implementing one or more aspects. As noted above, the code generated for each of the following processes is stored or otherwise embodied in computer readable storage media for access and use by the corresponding design tool or fabrication tool.

At block 502 a functional specification for the IC device is generated. The functional specification (often referred to as a micro architecture specification (MAS)) may be represented by any of a variety of programming languages or modeling languages, including C, C++, SystemC, Simulink, or MATLAB.

At block 504, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, System-Verilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 506 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 508, one or more EDA tools use the netlists produced at block 506 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 510, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions that, when executed by the one or more processors, manipulate the one or more processors to perform one or more aspects of the techniques described above. The software is stored or otherwise tangibly embodied on a computer readable storage medium accessible to the processing system, and can include the instructions and certain data utilized during the execution of the instructions to perform the corresponding aspects.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope as set forth in the claims below. Accordingly, the specification and figures are to be regarded in an illustrative rather than a restrictive sense, and all such modifications are intended to be included within the scope.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    initiating a compare operation to be executed at a content addressable memory (CAM) at a clock cycle of a clock signal;
    initiating a concurrent write operation to be executed at the CAM during the clock cycle; and
    suppressing an indication that data is stored at a first entry of the CAM in response to determining the first entry is a subject of the compare operation and the concurrent write operation.

2. The method of claim 1, wherein suppressing the indication comprises:
    generating the indication that the data is stored at the first entry;
    generating a control signal in response to determining the first entry is the subject of the concurrent write operation; and
    combining the indication and the control signal to generate a match signal indicating the first entry does not store the data.

3. The method of claim 2, wherein generating the control signal comprises decoding an address of the first entry to generate the control signal.

4. The method of claim 3, wherein generating the control signal comprises decoding the address to generate a plurality of control signals corresponding to entries of the CAM, each of the plurality of control signals, when asserted, to suppress a corresponding indication that data is stored at a corresponding entry of the CAM.

5. The method of claim 1, further comprising providing, responsive to the compare operation, an indication that data is stored at a second entry of the CAM in response to determining the second entry stores the data.

6. The method of claim 1, wherein the CAM stores cache tag information.

7. A method, comprising:
concurrently receiving compare data and write data at a content addressable memory (CAM), the compare data to be compared at the CAM during a same clock cycle as the write data is to be stored at the CAM; and
indicating the CAM does not store the compare data in response to determining the compare data is stored at a first entry that is to store the write data.

8. The method of claim 7, further comprising:
indicating the CAM does store the compare data in response to determining the compare data is stored at a second entry that is not to receive the write data.

9. The method of claim 7, wherein indicating the CAM does not store the compare data comprises:
generating a first signal indicating the CAM stores the compare data in response to determining the compare data is stored at an entry;
generating a second signal in response to determining the entry is to receive the write data; and
combining the first signal and the second signal to generate a third signal indicating the CAM does not store the compare data.

10. The method of claim 9, wherein generating the second signal comprises generating the second signal by decoding a write address at a first address decoder.

11. The method of claim 10, further comprising decoding the write address at a second address decoder to write the write data to the first entry.

12. A content addressable memory (CAM), comprising:
a storage array comprising a first entry, the CAM to generate a first signal indicating that the first entry stores compare data in response to a compare operation to be executed at the CAM during a clock cycle of a clock; and
a first address decoder to suppress the first signal in response to determining the first entry is a subject of a concurrent write operation that is to write data to the first entry during the clock cycle.

13. The CAM of claim 12, wherein the first address decoder is to generate a second signal in response to determining the first entry is the subject of the concurrent write operation, and further comprising a logic gate to combine the first signal and the second signal to generate a third signal, the third signal indicating that the first entry does not store the compare data.

14. The CAM of claim 12, further comprising a second address decoder to decode an address of the write operation to write data to the first entry.

15. The CAM of claim 14, wherein the first address decoder decodes the address of the write operation to generate the first signal.

16. The CAM of claim 12, wherein the storage array further comprises a second entry, the CAM to generate a second signal indicating that the second entry does not store the compare data.

17. The CAM of claim 12, wherein the CAM is to store cache tag information.

18. A computer readable medium storing code to adapt at least one computer system to perform a portion of a process to fabricate at least part of a processor comprising a content addressable memory (CAM), the CAM comprising:
a storage array comprising a first entry, the CAM to generate a first signal indicating that the first entry stores compare data in response to a compare operation to be executed at the CAM during a clock cycle of a clock; and
a first address decoder to suppress the first signal in response to determining the first entry is a subject of a concurrent write operation that is to write data to the first entry during the clock cycle.

19. The computer readable medium of claim 18, wherein the first address decoder generates a second signal in response to determining the first entry is the subject of the concurrent write operation, and further comprising a logic gate to combine the first signal and the second signal to generate a third signal, the third signal indicating that the first entry does not store the compare data.

20. The computer readable medium of claim 18, wherein the CAM further comprises a second address decoder to decode an address of the write operation to write data to the first entry.

* * * * *